(12) United States Patent
Hao et al.

(10) Patent No.: US 7,883,353 B2
(45) Date of Patent: Feb. 8, 2011

(54) ELECTRONIC STORAGE DEVICE HAVING MULTIPLE-DIRECTION ROTATION AND ALLOCATION ELECTRICAL CONNECTOR

(75) Inventors: Ping Hao, Suzhou (CN); Cheng-Chung Kung, Taipei (TW)

(73) Assignee: A-Data Technology (Suzhou) Co., Ltd., Suzhou, Jiangsu Province (CN)

( * ) Notice: Subject to any disclaimer, the term of this patent is extended or adjusted under 35 U.S.C. 154(b) by 62 days.

(21) Appl. No.: 12/533,423

(22) Filed: Jul. 31, 2009

(65) Prior Publication Data

US 2010/0151719 A1      Jun. 17, 2010

(30) Foreign Application Priority Data

Dec. 16, 2008   (CN) .................. 2008 1 0242825

(51) Int. Cl.
  *H01R 13/629* (2006.01)
(52) U.S. Cl. ...................................... 439/358
(58) Field of Classification Search ................ 439/358, 439/131, 136, 138; 361/684, 737; 710/300; 713/186
  See application file for complete search history.

(56) References Cited

U.S. PATENT DOCUMENTS

| 6,926,544 B2 | 8/2005 | Lee |
| 6,932,629 B2 | 8/2005 | Ikenoue |
| 7,466,556 B2 * | 12/2008 | Hiew et al. .................. 361/737 |
| 7,473,112 B2 | 1/2009 | Zhu et al. |
| 7,744,387 B2 * | 6/2010 | Yu et al. ...................... 439/136 |
| 7,794,246 B2 * | 9/2010 | Cheng ......................... 439/138 |
| 2008/0019090 A1 * | 1/2008 | Zhu et al. ..................... 361/684 |
| 2008/0094807 A1 * | 4/2008 | Hiew et al. ................... 361/737 |
| 2008/0232060 A1 * | 9/2008 | Yu et al. ...................... 361/684 |
| 2008/0276099 A1 * | 11/2008 | Nguyen et al. .............. 713/186 |
| 2008/0288697 A1 * | 11/2008 | Kim ............................ 710/300 |
| 2010/0075517 A1 * | 3/2010 | Ni et al. ....................... 439/131 |

FOREIGN PATENT DOCUMENTS

| CN | 1331379 C | 8/2005 |
| CN | 200941307 Y | 8/2007 |

* cited by examiner

*Primary Examiner*—Alexander Gilman
(74) *Attorney, Agent, or Firm*—Cheng-Ju Chiang

(57) ABSTRACT

An electronic storage device for connecting with a host system in accordance with the present invention includes a frame defining a receiving cavity, a main body rotatably received in the receiving cavity of the frame and including an electrical connector with an interface and a pivoting portion cooperating with the frame to realize the rotation of the main body. At least one of the frame and the main body forms a number of elastic pieces protruding into the receiving cavity. At least one of the main body and the frame defines a receiving space surrounded by a number of cooperating edges curved inwardly, and a number of recesses formed at the cross of each adjacent two cooperating edges. At a first position, the elastic pieces are respectively received in the recesses. As the main body is actuated to rotate, each elastic piece is actuated by the cooperating edge to produce deformation and slide along the curved cooperating edge and located in a neighboring recess with the main body rotating to a second position.

20 Claims, 6 Drawing Sheets

ELECTRONIC STORAGE DEVICE HAVING MULTIPLE-DIRECTION ROTATION AND ALLOCATION ELECTRICAL CONNECTOR

CROSS-REFERENCE TO RELATED APPLICATIONS

This application claims priority to and the benefit of Chinese Patent Application No. 200810242825.9 filed in the State Intellectual Property Office of P.R.C. (SIPO) on Dec. 16, 2008, the entire contents of which are incorporated herein by reference.

BACKGROUND OF THE INVENTION

1. Field of the Invention

The present invention relates to an electronic storage device, more particularly to an electronic storage device having an electrical connector capable of rotating and allocating in multiple-direction.

2. Description of Related Art

In recent years, because of rapid development of Flash Memory technology, electronic data cannot only be stored in general hard disks, but also stored in solid memories conveniently. Compared with general hard disks, solid memory is more compact with less weight and shake resistance. Therefore, solid memories are widely used in different kinds of host systems, such as personal computers, notebooks, PDA (Personal Digital Assistance), and mobile phones et al. Different types of electronic storage devices adopting solid memory as storage media are widely used in daily life, such as Express Card, Flash Memory Card, USB Flash Drive, and MP3 Player.

However, no matter what type the electronic storage device belongs to, there must have an electrical connector, such as a USB connector, connects the host system and the electronic storage device, electronic data can then be transferred from the host system to the electronic storage device. If the electrical connector of the electrical storage device is damaged, the electronic storage device cannot be used any longer. Hence, after the electrical connector is separated from the host system, the electrical connector should be protected to lengthen the service life thereof. CN1331379C, issued on Aug. 8, 2007, disclosed a Flash Drive apparatus which has a single body type rotary cover connecting with a main body which receives a USB connector inside by hinge means. The rotary cover forms protection to the USB connector to some extent. However, after long time use, the connection between the main body and the rotary cover is prone to become loose and cause relative rotation between the main body and the rotary cover, thus, it is not good for protection to the USB connector interface.

Further, as disclosed in CN200941307Y, issued on Aug. 29, 2008, a USB Flash drive apparatus utilized a U-shape metal ring which is capable of elastic deformation and can be served for rotating allocation. However, the rotating structure of the USB Flash drive apparatus is relatively complex which is not good for improving production efficiency.

Hence, it is desirable to design an improved structure to address problems mentioned above.

BRIEF SUMMARY OF THE INVENTION

Accordingly, an object of the present invention is to provide an electronic storage device having simple structure and capable of realizing rotation and allocation in multiple-direction.

In order to achieve the above-mentioned object, an electronic storage device for connecting with a host system in accordance with the present invention comprises a frame defining a receiving cavity, a main body rotatably received in the receiving cavity of the frame and comprising an electrical connector with an interface and a pivoting portion cooperating with the frame to realize the rotation of the main body. At least one of the frame and the main body forms a plurality of elastic pieces protruding into the receiving cavity or formed with the pivoting portion. At least one of the main body and the frame defines a receiving space surrounded by a plurality of cooperating edges curved inwardly, and a plurality of recesses formed at the cross of each adjacent two cooperating edges. At a first position, the elastic pieces are respectively received in the recesses. As the main body is actuated to rotate, each elastic piece is actuated by the cooperating edge to produce deformation and slide along the curved cooperating edge and located in a neighboring recess with the main body rotating to a second position.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
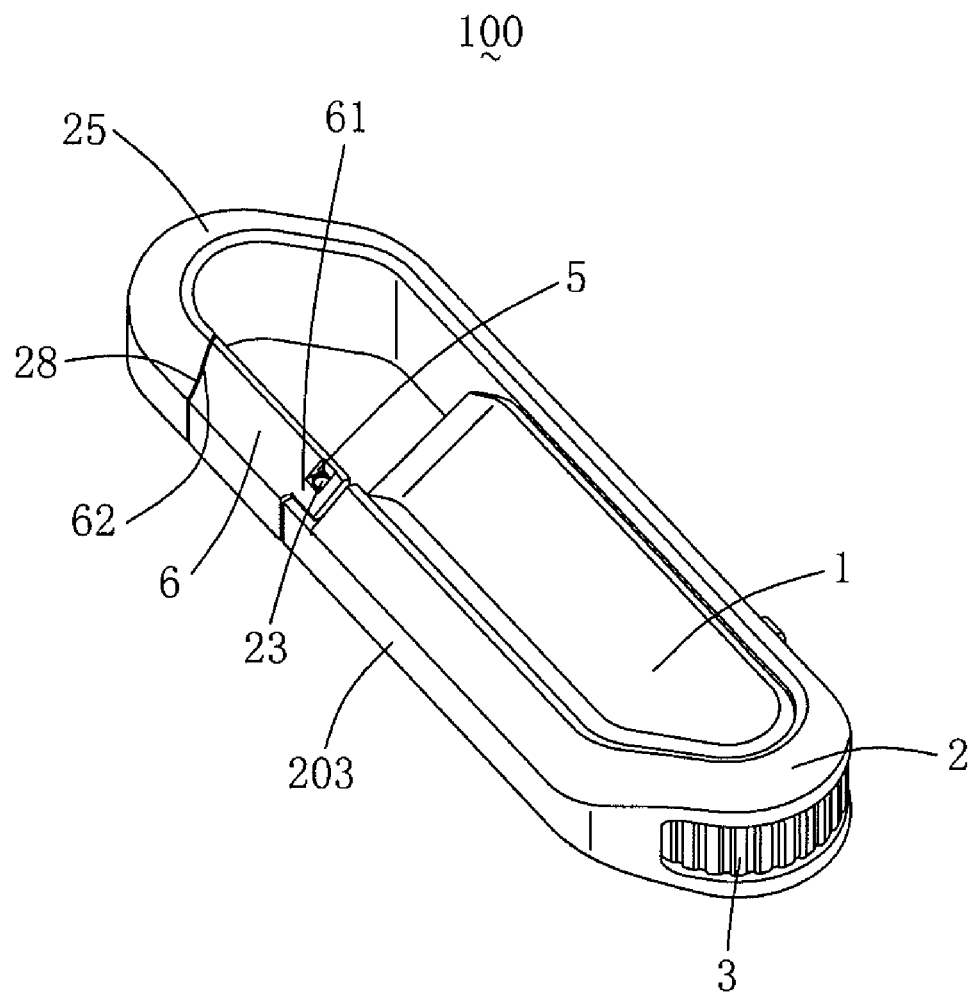
FIG. 1 is an assembled, perspective view of an electronic storage device in accordance with the present invention.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Reference will be made to the drawing figures to describe the present invention in detail, wherein depicted elements are not necessarily shown to scale and wherein like or similar elements are designated by same or similar reference numeral through the several views and same or similar terminology.

Referring to FIGS. 1-4, an electronic storage device 100 in accordance with the present invention comprises a frame 2, a top cover 1 assembled to the frame 2, a bottom cover 4 assembled to the frame 2 and cooperating with the top cover 1, and a main body 3 received in the frame 2 and capable of rotating and allocating relative to the frame 2 and top and bottom covers 1, 4 in multiple-direction.

Figure 2:
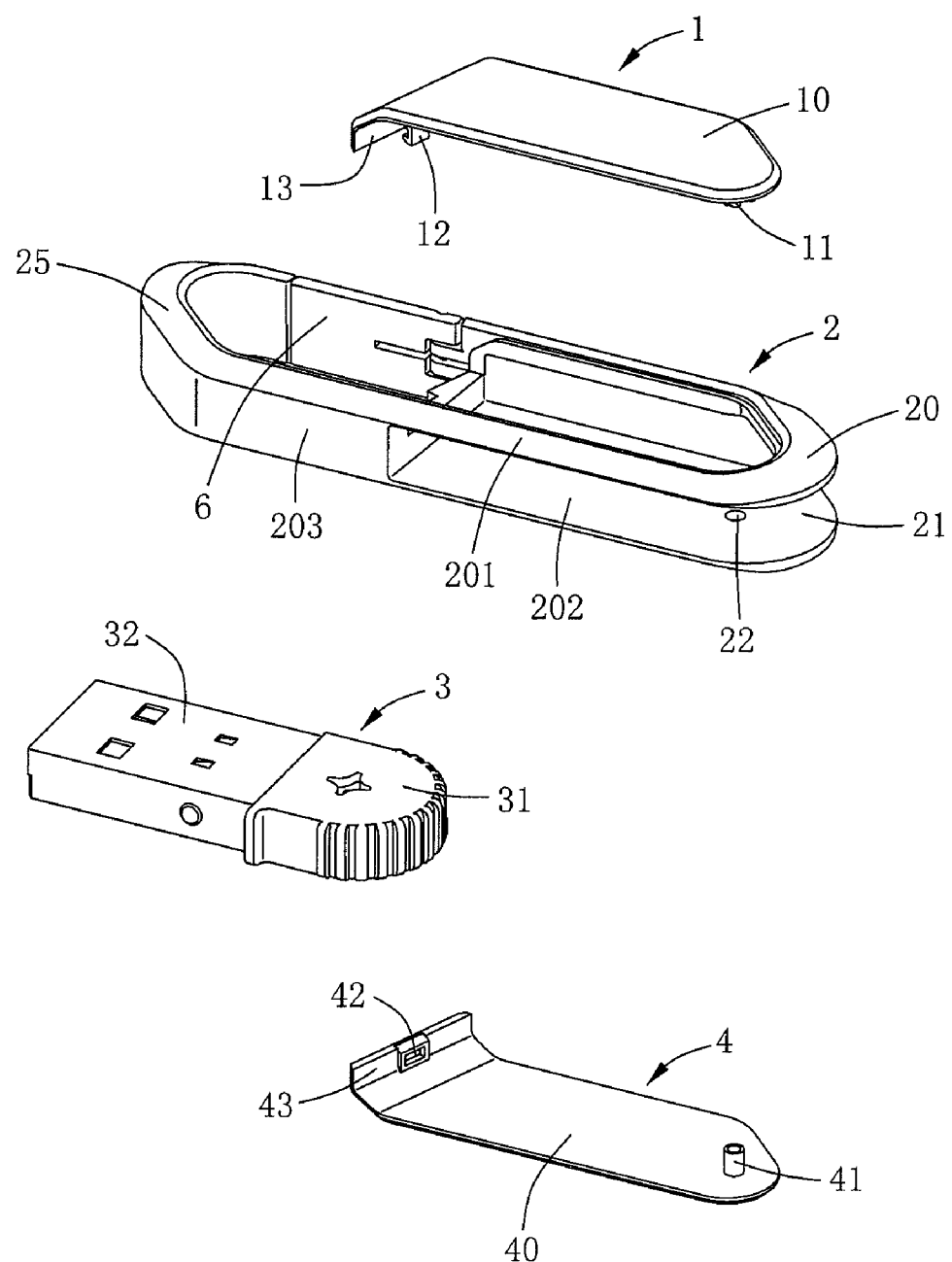
FIG. 2 is an exploded, perspective view of the electronic storage device.
Figure 3:
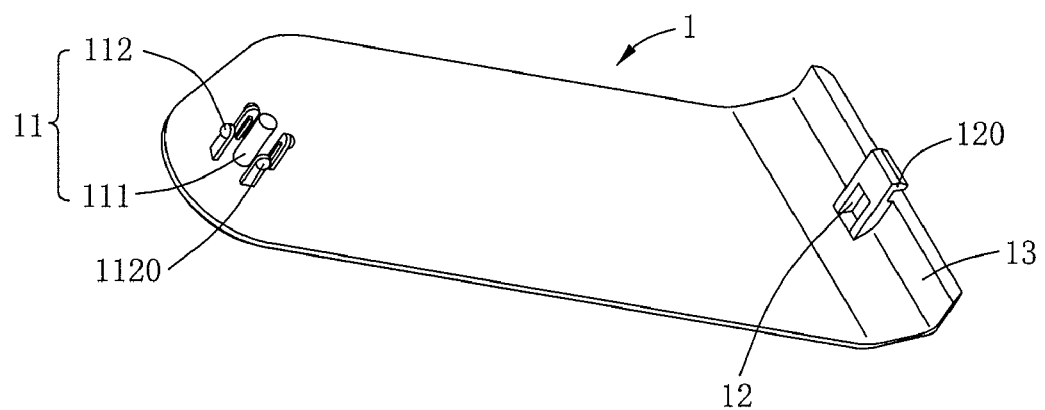
FIG. 3 is an enlarged view of a top cover of the electronic storage device viewed from a bottom aspect.

Referring to FIGS. 2-3, the top cover 1 is of L-shape and comprises a flat first body section 10 and a first protection section 13 bending downwardly from one end of the first body section 10. A first latch section 12 is formed adjacent to the first protection section 13 with a latch 120 thereof extending beyond a bottom edge of the protection section 13. A positioning region 11 is formed at the other end of the first body section 10 and protrudes downwardly from the bottom surface. The positioning region 11 comprises a first positioning section 111 in the center thereof and four elastic pieces 112 located around the first positioning section 111. Each elastic piece 112 is formed with a ball-shape protrusion 1120 at a free end thereof for cooperating with the main body 3 and provides a pause feeling when rotating.

Figure 5:
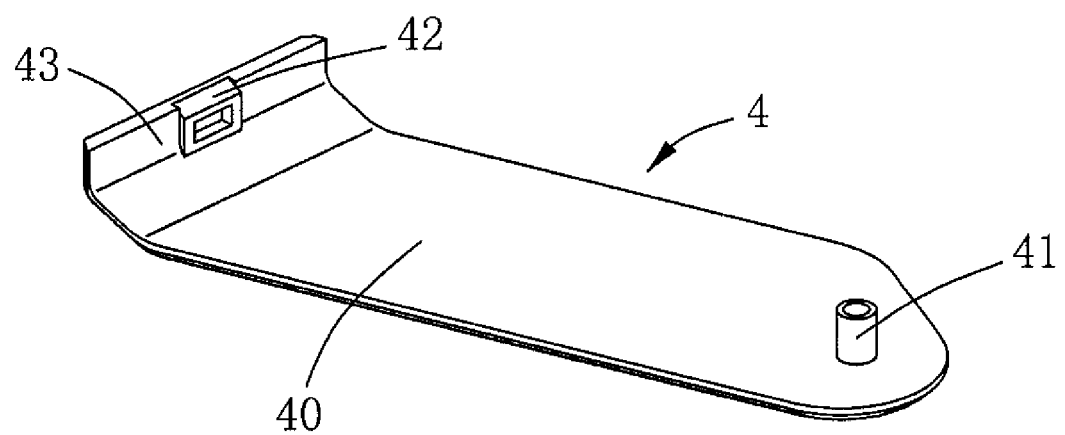
FIG. 5 is an enlarged view of a bottom cover of the electronic storage device viewed from a top aspect.

Referring to FIGS. 2 and 5, the bottom cover 2 comprises a flat second body section 40 and a second protection section 43 curved upwardly from one end of the second body section 40. A second latch section 42 is formed adjacent to a distal end of the second protection section 43 and latches with the first latch section 12 of the top cover 1 to secure the covers 1, 4 together. When the first and second latch sections 12, 42 latch with each other, the first and second protection sections 13, 43 contact each other to cover the interface of an electrical connector 32 of the main body 3 for protecting the interface. A hollow column-shape second positioning section 41 is formed at the other end of the second body section 40 and protrudes upwardly from the top surface. The inner diameter of the second positioning section 41 is slightly larger than the outer diameter of the first positioning section 111, thus, after the covers 1, 4 are assembled to each other, the first positioning section 111 can be interferentially received in the second positioning section 41.

Figure 4:
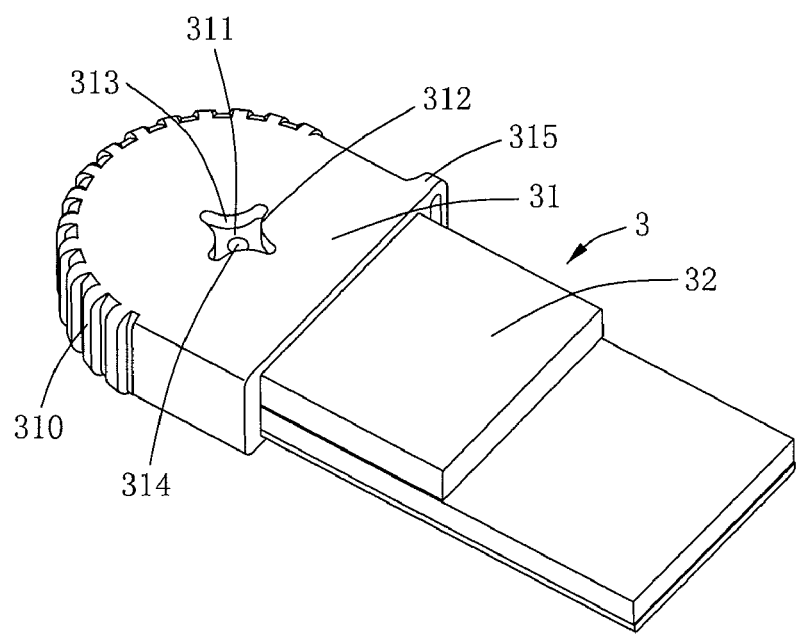
FIG. 4 is an enlarged view of a main body of the electronic storage device viewed from a top aspect.

Referring to FIGS. 2 and 4, the main body 3 comprises the electrical connector 32 (in the preferred embodiment, the electrical connector 32 is a USB type), and a pivoting portion 31. A semi-circular outer edge 310 of the pivoting portion 31 is slotted with a plurality of slots for being actuated by hand conveniently. The pivoting portion 31 defines a receiving space 311 recessed downwardly a certain distance from a top surface thereof and a circular positioning hole 314 recessed upwardly from a bottom surface thereof to communicate with the receiving space 311. The receiving space 311 is surrounded by four cooperating edges 313 curved inwardly and forming four arc-shape recesses 312, correspondingly. A stop section 315 protrudes outwardly at one end of the pivoting portion 31 and adjacent to the electrical connector 32.

Referring to FIGS. 1 and 2, the frame 2 comprises a main portion 20 and an L-shape holding portion 25 extending from one side of the main portion 20. The main portion 20 comprises an upper wall 201, a lower wall 202 opposite to the upper wall 201, and a lateral wall 203 connecting with the upper and lower walls 201, 202 and is partially cutoff to form an L-shape receiving cavity 21 together with the upper and lower walls 201, 202 for accommodating the main body 3. A circular positioning hole 22 with a dimension corresponding to that of the second positioning section 41 is defined through the lower wall 202 at one end of the main portion 20 and communicates with the receiving cavity 21 for penetration of the second positioning section 41. So, after the main body 3 is assembled to the frame 2, the pivoting portion 31 is received in the receiving cavity 21 with the positioning holes 314, 22 aligning with each other. Then, the first and second covers 1, 4 are respectively assembled to the upper and lower walls 201, 202 of the frame 2 with the first positioning section 111 and the four elastic pieces 112 protruding into the receiving space 310, while the second positioning section 41 protruding through the position holes 22, 314 respectively and interferentially receiving the first positioning section 11 therein. Thus, the four elastic pieces 112 are respectively received in the arc-shape recesses 312. At the same time, the first and second protection sections 13, 43 combine with each other via the combination of the first and second latch sections 12, 42.

In addition, referring to FIGS. 1-2 and 7A-7C, the present invention also provides a shaft 5 assembled to the lateral wall 203, and a latch 6 pivotably assembled to the shaft 5 and between the lateral wall 203 and the holding portion 25 to be served as a mountaineering latch. One end of the lateral wall 203 defines a shaft-receiving hole 23 and the shaft 5 protrudes through one end 61 of the latch 6 then is received in the shaft-receiving hole 23. The latch 6 has the other end which is tapered as a tapered end 62 and is capable of rotating relative to the shaft 5 and the tapered end 62 can be stopped by a block section 28 formed at the free end of the holding portion 25. Thus, when the latch 6 is served as a mountaineering latch, the latch 6 can be blocked by the block section 28 for preventing separating from the frame 2 easily, thus, for safety security.

Figure 6:
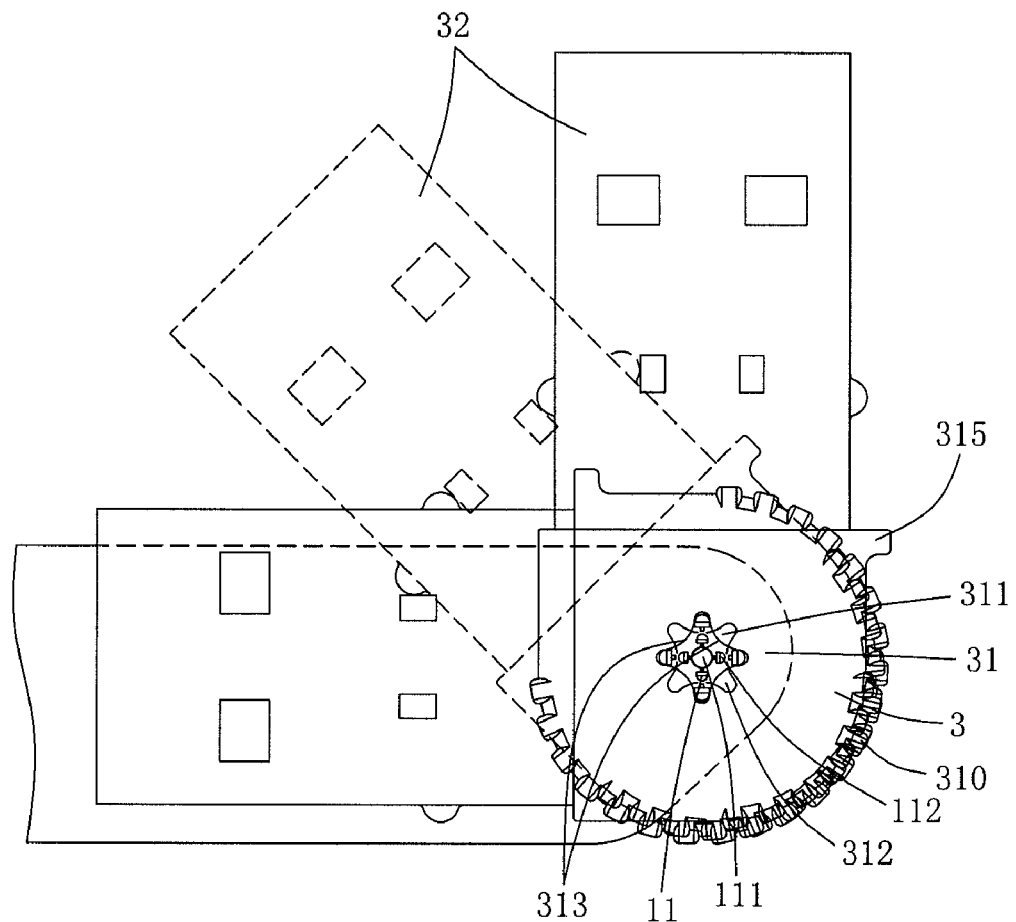
FIG. 6 is a sketch view illustrating how the main body rotates relative to other parts.
Figure 7A:
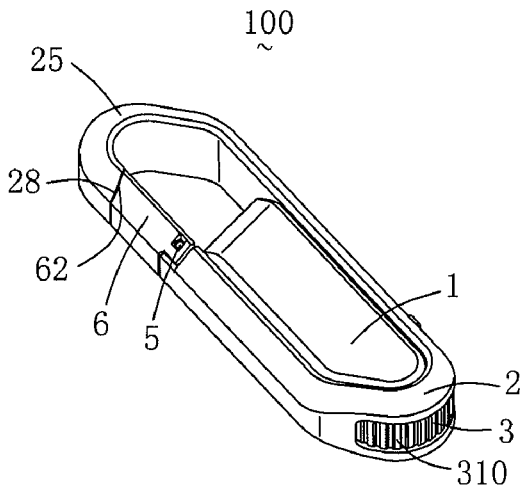
FIGS. 7A-7C are views illustrating different using states of the electronic storage device, and the electronic storage device respectively rotates 90 degrees and 180 degrees in FIGS. 7B and 7C.
Figure 7B:
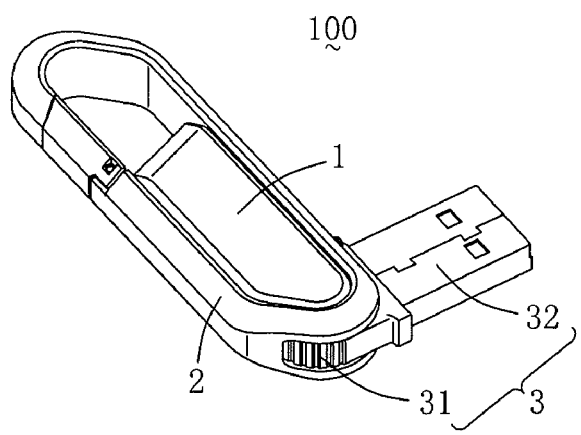
Figure 7C:
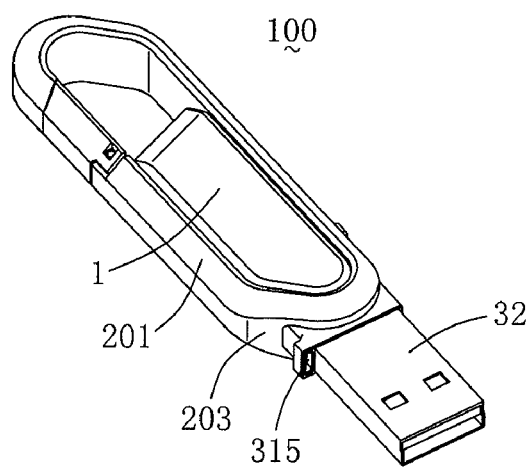

Please refer to FIGS. 1 and 7A, after assembly, the main body 3 is received in the receiving cavity 21 in a zero degree position. When operation, referring to FIGS. 6 and 7B, an operator rotates the outer edge 310 along clockwise direction, the main body 3 is actuated to rotate along the same direction. Then, the curved cooperating edges 313 rotate along outer surfaces of the ball-shape protrusions 1120 of the elastic pieces 112 and cause the elastic pieces 112 to produce deformation that is bending inwardly. The elastic pieces 112 leave corresponding arc-shape recesses 312 and when the rotating angle is larger than 45 degrees, under the elastic restore force of the elastic pieces 112 and the outer operating force. The main body 3 can continue rotating automatically until the elastic pieces 112 each is located in next arc-shape recess 312. Now, the main body 3 rotates 90 degrees relative to the frame 2 as illustrated in FIG. 7B. Then, the main body 3 can rotate another 90 degrees until the stop section 314 is stopped by the lateral wall 203 of the frame 2. Now, the main body 3 rotates 180 degrees relative to the frame 2 compared with the zero degree position illustrated in FIG. 7A. When the rotating angle is less than 45 degrees, such as 30 degrees, the main body 3 will not rotate to the next position and return back to the original position, thus, the main body 3 does not rotate relative to the frame 2.

In summary, the operator needs to rotate the main body 3 more than an angle equal to 180 degrees divides the number of the cooperating edges 313, and then the main body 3 can rotate at an angle equal to 360 degrees divides the number of the cooperating edges 313. For example, when the receiving space 311 has six curved cooperating edges 313, then the operator needs to rotate the main body 3 more than 30 degrees, the main body 3 can automatically rotate relative to the frame 2 at 60 degrees, 120 degrees and 180 degrees. In addition, the top and bottom covers 1, 4 are made by metal and have handsome appearance. The locations of the elastic pieces 112 and the curved cooperating edges 313 can exchange with each other, that is, the main body 3 can be structured with the elastic pieces 112, and the frame 2 or the top cover 1 can be structured with the receiving space 311 formed by the curved cooperating edges 313.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed. For example, the tongue portion is extended in its length or is arranged on a reverse side thereof opposite to the supporting side with other contacts but still holding the contacts with an arrangement indicated by the broad general meaning of the terms in which the appended claims are expressed.

We claim:

1. An electronic storage device adapted for connecting with a host system, comprising:
    a frame defining a receiving cavity;
    a main body rotatably received in the receiving cavity of the frame and comprising an electrical connector with an interface and a pivoting portion cooperating with the frame to realize the rotation of the main body; and wherein
    at least one of the frame and the main body forms a plurality of elastic pieces protruding into the receiving cavity, and at least one of the main body and the frame defines a receiving space surrounded by a plurality of cooperating edges curved inwardly, and a plurality of recesses formed at the cross of each adjacent two cooperating edges; and wherein
    at a first position, the elastic pieces are respectively received in the recesses, as the main body is actuated to rotate, each elastic piece is actuated by the cooperating edge to produce deformation and slide along the curved cooperating edge and located in a neighboring recess with the main body rotating to a second position.

2. The electronic storage device as claimed in claim 1, wherein after the elastic piece passes the middle point of each cooperating edge, the main body is capable of rotating automatically to the next position.

3. The electronic storage device as claimed in claim 1, wherein the number of the elastic pieces is less than or equal to that of the cooperating edges.

4. The electronic storage device as claimed in claim 1, wherein the main body is actuated to rotate at an angle more than 180 degrees divide the number of the cooperating edges, and wherein the main body is capable of rotating automatically at an angle equal to 360 degrees divide the number of the cooperating edges.

5. The electronic storage device as claimed in claim 1, wherein the elastic pieces are formed with the frame and protrude into the receiving cavity, and wherein the main body defines the receiving space surrounded by the cooperating edges.

6. The electronic storage device as claimed in claim 5, wherein the frame further comprises a cover assembled thereto, and wherein the elastic pieces depend downwardly from one end of the cover to cooperate with the cooperating edges of the main body.

7. The electronic storage device as claimed in claim 6, wherein the cover forms a protection section bending from the other end thereof to cover the interface of the electrical connector to form protection thereto.

8. The electronic storage device as claimed in claim 6, wherein the cover forms a positioning section with the elastic pieces surrounding the positioning section in the center, and wherein the positioning section protrudes into the receiving space and the receiving cavity to position the cover relative to the frame.

9. The electronic storage device as claimed in claim 8, wherein the cover is a top cover, the electronic storage device further comprises a bottom cover assembled to the frame and combined with the top cover to protect the interface of the electrical connector together.

10. The electronic storage device as claimed in claim 9, wherein the top cover forms a first latch section, and wherein the bottom cover forms a second latch section latching with the first latch section.

11. The electronic storage device as claimed in claim 9, wherein the bottom cover forms a second positioning section protruding into the receiving space and the receiving cavity to cooperate with the positioning section of the top cover.

12. The electronic storage device as claimed in claim 11, wherein positioning sections are of column shape, and wherein the inner diameter of second positioning section is slightly larger than outer diameter of the positioning section.

13. The electronic storage device as claimed in claim 1, wherein there are four cooperating edges and four elastic pieces, and wherein the main body is actuated to rotate more than 45 degrees along clockwise direction, the main body is capable of rotating 90 degrees automatically relative to the frame.

14. The electronic storage device as claimed in claim 10, wherein the frame comprises a lateral wall forming an L-shape holding portion for conveniently portable use.

15. The electronic storage device as claimed in claim 14, further comprising a latch assembled to the lateral wall to form a close loop together with the holding portion.

16. The electronic storage device as claimed in claim 15, further comprising a shaft assembled to one end of the lateral wall, and wherein the latch is assembled to the shaft and is capable of rotating relative to the shaft.

17. The electronic storage device as claimed in claim 15, wherein the lateral wall forms a block section at the other end thereof, and wherein the latch is capable of being blocked by the block section for preventing from being separated from the frame.

18. The electronic storage device as claimed in claim 1, wherein each elastic piece forms a ball-shape protrusion at a free end thereof cooperating with the cooperating edge.

19. An electronic storage device adapted for connecting with a host system, comprising:
    a frame defining a receiving cavity;
    a cover assembled to the frame and comprising a body section forming a protection section at one end thereof and a plurality of elastic pieces at the other end thereof to protrude into the receiving cavity; and
    a main body rotatably received in the receiving cavity of the frame and comprising an electrical connector having an interface adapted for electrically connecting with the host system, and defining a receiving space surrounded by a plurality of cooperating edges; and wherein
    the protection section of the cover covers the interface of the electrical connector to form protection thereto and the elastic pieces are capable of being actuated by the cooperating edges to elastically deform inwardly when the main body is actuated to rotate and be allocated in a next position.

20. The electronic storage device as claimed in claim 19, wherein the main body is actuated to rotate at an angle more than 180 degrees divide the number of the cooperating edges, and wherein the main body is capable of rotating at an angle equal to 360 degrees divide the number of the cooperating edges relative to the frame.

* * * * *